US009590645B2

(12) United States Patent
Jackson et al.

(10) Patent No.: US 9,590,645 B2
(45) Date of Patent: Mar. 7, 2017

(54) APPARATUS AND METHOD FOR PHASE LOCKED LOOP BANDWIDTH EXPANSION

(71) Applicant: Hughes Network Systems, LLC, Germantown, MD (US)

(72) Inventors: Thomas Jackson, Monrovia, MD (US); George Eapen, Germantown, MD (US)

(73) Assignee: Hughes Networks Systems, LLC, Germantown, MD (US)

( * ) Notice: Subject to any disclaimer, the term of this patent is extended or adjusted under 35 U.S.C. 154(b) by 0 days.

(21) Appl. No.: 14/816,448

(22) Filed: Aug. 3, 2015

(65) Prior Publication Data

US 2016/0065228 A1 Mar. 3, 2016

Related U.S. Application Data

(63) Continuation of application No. 13/400,959, filed on Feb. 21, 2012, now Pat. No. 9,099,960.

(51) Int. Cl.
*H03L 7/08* (2006.01)
*H03C 3/08* (2006.01)
*H03C 3/09* (2006.01)
*H03L 7/10* (2006.01)

(52) U.S. Cl.
CPC ............... *H03L 7/10* (2013.01); *H03C 3/08* (2013.01); *H03C 3/0908* (2013.01); *H03L 7/08* (2013.01)

(58) Field of Classification Search
CPC ....... H03C 3/0908; H03C 3/0991; H03L 7/08; H03L 7/10–7/1077
USPC .......... 375/215, 294, 327, 373–376; 455/260
See application file for complete search history.

(56) References Cited

U.S. PATENT DOCUMENTS

| | | | |
|---|---|---|---|
| 4,755,773 A | 7/1988 | Ohmagari | |
| 5,432,723 A | 7/1995 | Chen et al. | |
| 6,008,703 A | 12/1999 | Perrott et al. | |
| 6,097,765 A | 8/2000 | Corrigan et al. | |
| 6,366,620 B1 | 4/2002 | Jackson et al. | |
| 7,075,376 B1 | 7/2006 | Huff et al. | |
| 7,502,602 B2 | 3/2009 | Wolf | |
| 2003/0154453 A1* | 8/2003 | Gauthier | G06F 17/5036 716/113 |
| 2004/0178859 A1 | 9/2004 | Fontaine et al. | |
| 2005/0073369 A1 | 4/2005 | Balboni et al. | |
| 2006/0055466 A1 | 3/2006 | Hirano et al. | |

(Continued)

FOREIGN PATENT DOCUMENTS

| | | |
|---|---|---|
| EP | 1 583 224 | 10/2005 |
| WO | 99/14850 | 3/1999 |

OTHER PUBLICATIONS

S. Jiang, F. You and S. He, "A wideband sigma-delta PLL based phase modulator with pre-distortion filter," 2012 International Conference on Microwave and Millimeter Wave Technology (ICMMT), May 2012.*

(Continued)

*Primary Examiner* — Matthew Sandifer
(74) *Attorney, Agent, or Firm* — K&L Gates LLP

(57) ABSTRACT

An apparatus for PLL bandwidth expansion including a compensation filter and a phase locked loop, where the compensation filter is programmed with a compensation function derived based on programmable coefficients and parameters of a transmitting device, a frequency response of the phase locked loop, and a wanted frequency response.

22 Claims, 5 Drawing Sheets

(56) References Cited

U.S. PATENT DOCUMENTS

2006/0128300 A1    6/2006  Coffin, III

OTHER PUBLICATIONS

Extended Search Report dated Jun. 20, 2013 issued in corresponding European Patent Application No. 13155847.0.
Chou et al., "FPGA Implementation of Digital Filters", ICSPAT '93, pp. 1-9, 1993.
Altera Corporation, "Implementing High Performance DSP Functions in Stratix & Stratix GX Devices", S52007-1.1, Sep. 2004.
Wikipedia.org, "Butterworth filter", retrieved from https://web.archive.org/web/20111218055053/http://en.wikipedia.org/wiki/Butterworth_filter, Dec. 2011.
Mansuri et al., "Jitter optimization based on phase-locked loop design parameters", IEEE J. of Solid-State Circuits, vol. 37, No. 11, pp. 1375-1382, 2002.
Perrott, "PLL Design using the PLL Design Assistant Program", Jul. 2008.

* cited by examiner

APPARATUS AND METHOD FOR PHASE LOCKED LOOP BANDWIDTH EXPANSION

PRIORITY CLAIM

The present application is a continuation of, claims priority to and the benefit of U.S. patent application Ser. No. 13/400,959, now U.S. Pat. No. 9,099,960, filed on Feb. 21, 2012, the entirety of which is incorporated herein by reference.

BACKGROUND

Devices that transmit wireless signals, such as Very Small Aperture Terminals (VSATs) in satellite communication systems, and cellular devices, may transmit the wireless signals on phase modulated carriers. The fidelity of a phase modulated carrier which is passed through a phase locked loop may be degraded by the bandwidth of that phase locked loop. The phase locked loop may reduce the bandwidth of the transmitting device, resulting in poorer performance than could be achieved by the rest of the components in the signal path of the receiving device.

SUMMARY

It is an object of the present invention to provide an apparatus and method for phase locked loop bandwidth expansion.

In accordance with an aspect of the present invention, an apparatus for PLL bandwidth expansion includes a compensation filter and a phase locked loop, where the compensation filter is programmed with a compensation function derived based on programmable coefficients and parameters of a transmitting device, a frequency response of the phase locked loop, and a wanted frequency response.

Additional objects, advantages and novel features of the invention are set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION

The limitation on bandwidth caused by the use of a phase locked loop in a transmitting device may be overcome by using a compensation filter in the signal path at the baseband modulator. The compensation filter may expand the bandwidth of the signal path, and thus eliminate the limitation imposed by the bandwidth of the phase locked loop.

Figure 1:
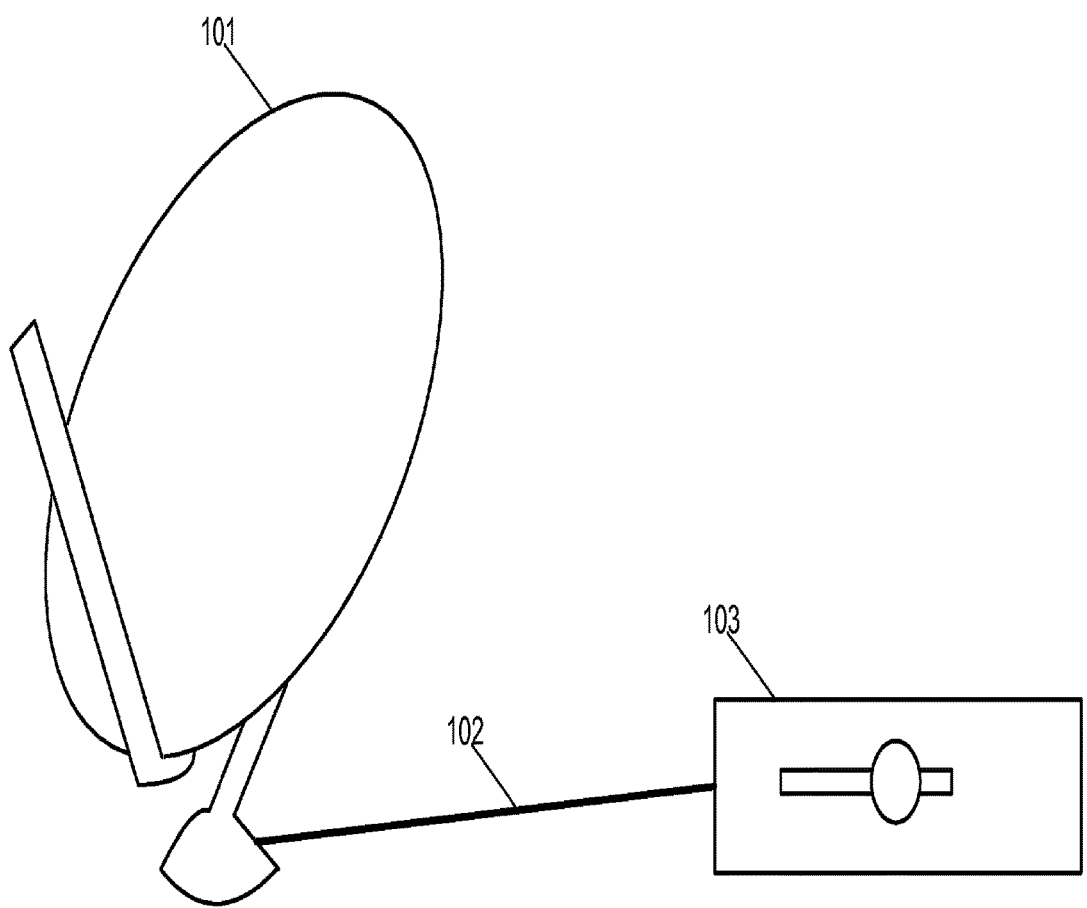
FIG. 1 depicts an exemplary VSAT with indoor unit (IDU) and outdoor unit (ODU).

The compensation filter may be implemented in a transmitting device, such as, for example, a VSAT. FIG. 1 depicts an exemplary VSAT with indoor unit (IDU) and outdoor unit (ODU). The ODU 101 may be, for example, a satellite dish in combination with electronics for signal processing. The IDU 103 may be a set top box including a receiver and a transmitter that may transmit a signal to the ODU 101 on a cable, such as the coaxial cable 102, so that the ODU 101 can transmit the signal to, for example, a satellite. The IDU 103 may perform processing on the wireless signal to be transmitted by the ODU 101, including, for example, inserting data into the signal. The signal may carry any suitable type of data, such as, for example, television data, or IP traffic. The ODU 101 may receive and process the signal from the IDU 103, and may transmit the signal as a wireless signal carried on a phase modulated carrier to a satellite, using, for example, a satellite dish.

Figure 2:
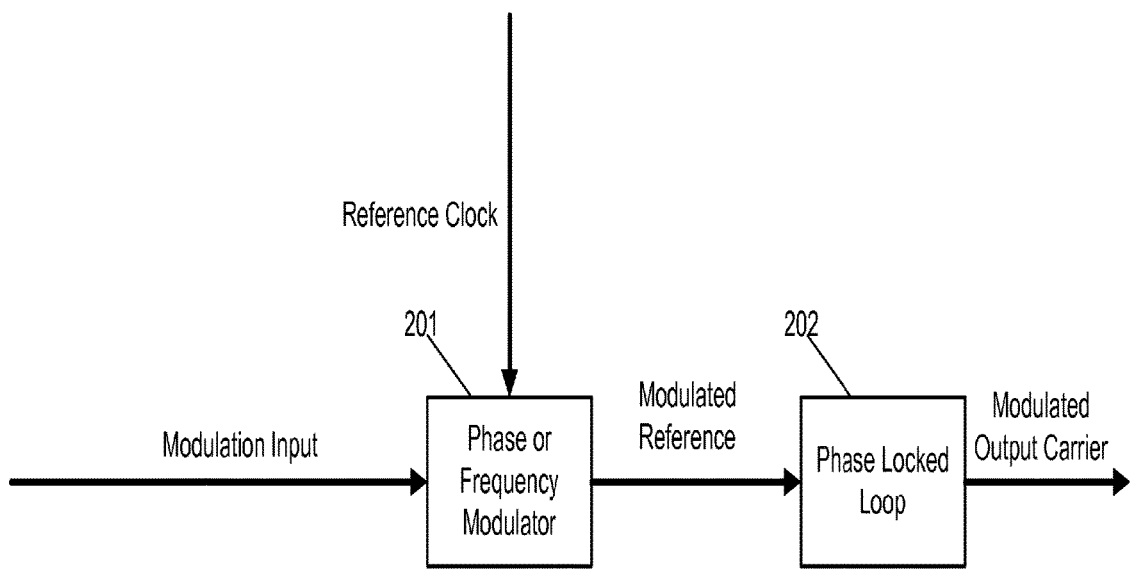
FIG. 2 depicts an exemplary signal path.

FIG. 2 depicts an exemplary signal path in a transmitting device. The signal path in the transmitting device, for example, in a VSAT, may be implemented with any suitable combination of hardware and software, including, for example, an application-specific integrated circuit (ASIC) or field programmable gate array (FPGA). The signal path may include a phase or frequency modulator 201 which may receive a reference signal which may then be modulated by an input data signal to produce a modulated signal, which may then be used as a modulated reference into a phase locked loop 202. The phase locked loop 202 may reside, for example, in the ODU 101 or the IDU 103 of a VSAT. The output of the phase locked loop 202 may be given by the transfer function:

$$PLL(s) = \frac{s \cdot x_1 + x_0}{s^5 + s^4 \cdot x_4 + s^3 \cdot x_3 + s^2 \cdot x_2 + s \cdot x_1 + x_0},$$

where $$x_0 = a \cdot K_\phi A \cdot b \cdot w_n^2 \cdot \frac{K_{vco}}{N},$$

$$x_1 = K_\phi A \cdot b \cdot w_n^2 \cdot \frac{K_{vco}}{N},$$

$$x_2 = w_n^2 \cdot b,$$

$$x_3 = w_n^2 + 2\xi \cdot w_n \cdot b,$$

$$x_4 = w_n^2 + 2\xi \cdot w_n \cdot b,$$

and where s may be the Laplace transform operator (jw), and a, b, $K_{vco}$, $K_\phi$, N, A, $\xi$, $w_n$ may be programmable coefficients or parameters of the transmitting device, for example, of the ODU 101, and may be stored on the transmitting device at the time of manufacture. a may represent a "zero", b may represent a "pole", $K_{vco}$ may represent VCO gain, $K_\phi$ may represent phase detector gain, N may represent a variable divider value, A may represent a gain value, $\xi$ may represent a damping factor, and $w_n$ may represent a $2^{nd}$ order filter natural frequency. Exemplary values for the programmable coefficients may be A=0.53826, $K_{vco}=2\pi \cdot 375e^6$, $$K_\phi = \frac{2}{2\pi},$$

N=32, $\xi$=0.462, $w_n=2\pi \cdot 15.65e^6$  a=$2\pi \cdot 37.7e^3$, and b=$2\pi \cdot 9.9e^6$.

The magnitude response of the phase locked loop 202 may cause the phase locked loop 203 to act as a lowpass filter, with a passband limit less than some of the typical signals that may be received by the ODU 101. The lowpass property of the phase locked loop 202 may distort the transmitted signals heavily when signal bandwidth is wider than the filter bandwidth of the phase locked loop 202. This may result in the phase locked loop 202 limiting the overall bandwidth of the receiving device.

Figure 3:
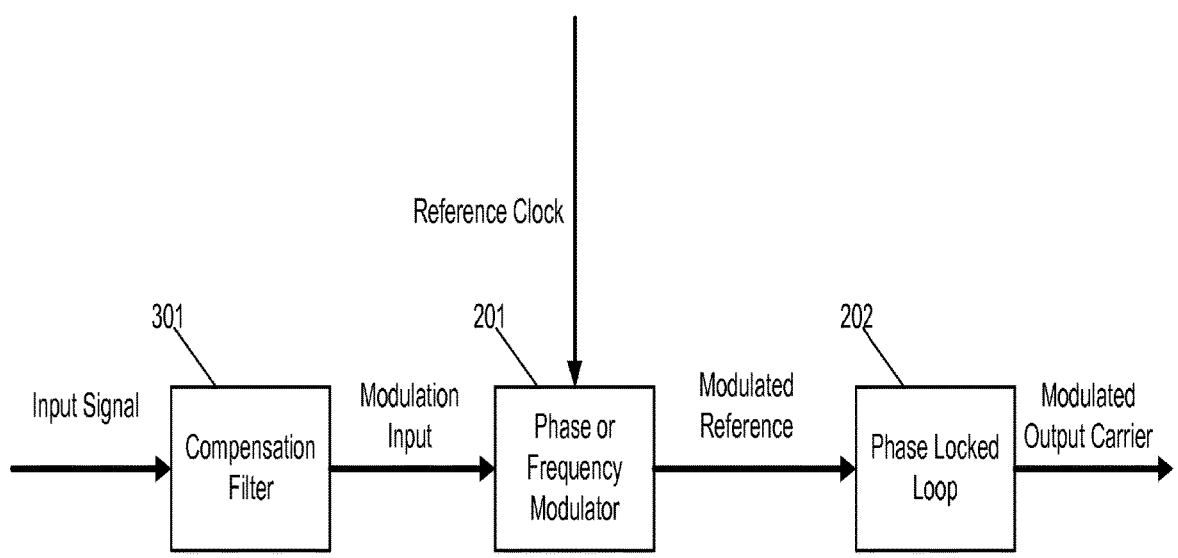
FIG. 3 depicts an exemplary signal path with a compensation filter.

A compensation filter 301 may be installed in the transmitting device in front of the phase locked loop 202 and the phase or frequency modulator 201. FIG. 3 depicts an exemplary signal path with a compensation filter. The compensation filter 301 may be a programmable hardware filter implemented in the ASIC or FPGA of, for example, the IDU 102.

The compensation filter 301 may pre-distort the transmitted signal, such that after low pass filter distortion by the phase locked loop 202, the transmitted signal at an antenna connector port of the ODU 101 preserves the original signal from the IDU 102 with less distortion. The combined filter response of the compensation filter 301 and the phase locked loop 202 to the baseband signal may be equivalent to a Butterworth filter or any other appropriate function.

The desired response of the combination of the compensation filter 301 and the phase locked loop 202, Freq(s), may be:

$$Freq(s) = \frac{wa^4}{s^4 + s^3 \cdot b_3 \cdot wa + s^2 \cdot b_2 \cdot wa^2 + s \cdot b_1 \cdot wa^3 + wa^4},$$

where wa may be the wanted bandwidth in radians/Hertz, and where, for a Butterworth response, $b_3$ may be 2.6, $b_2$ may be 3.4, and $b_1$ may be 2.6. By dividing the desired response by the response of the phase locked loop 202, the fifth order compensation function, Fcomp(s), for the compensation filter 301 may be derived as:

$$Fcomp(s) = \frac{y_0 \cdot (s^5 + s^4 \cdot x_4 + s^3 \cdot x_3 + s^2 \cdot x_2 + s \cdot x_1 + x_0)}{x_1 \cdot (s^5 + s^4 \cdot z_4 + s^3 \cdot z_3 + s^2 \cdot z_2 + s \cdot z_1 + z_0)},$$

where $y_0 = wa^4$, $y_1 = b_1 \cdot wa^3$, $y_2 = b_2 \cdot wa^2$, $y_3 = b_3 \cdot wa$, $z_0 = y_0 \cdot \frac{x_0}{x_1}$, $z_1 = y_0 + y_1 \cdot \frac{x_0}{x_1}$, $z_2 = y_1 + y_2 \cdot \frac{x_0}{x_1}$, $z_3 = y_2 + y_3 \cdot \frac{x_0}{x_1}$, and $z_4 = y_3 + \frac{x_0}{x_1}$.

To simplify implementation of the compensation filter 301, $w_n$ may be assumed to be very large, which may allow the 4$^{th}$ and 5$^{th}$ order terms to be ignored. The phase locked loop 202 frequency response may be approximated, for example, by:

$$PLL(s) = \frac{s \cdot c_1 + c_0}{s^3 + s^2 \cdot c_2 + s \cdot c_1 + c_0}$$

where $c_0 = a \cdot K_\phi A \cdot K_{vco} \cdot \frac{b}{N}$ $c_1 = K_\phi A \cdot K_{vco} \cdot \frac{b}{N}$, and $c_2 = b$.

The desired second order frequency response, Freq(s), may be $$Freq(s) = \frac{wa^2}{s^2 + 2\xi \cdot wa \cdot s + wa^2},$$

where for a Butterworth response $\xi$ may be equal to 0.707.

By dividing the desired response by the response of the phase locked loop 202, the third order compensation function, Fcomp(s), for the compensation filter 301 may be derived as:

$$Fcomp(s) = \frac{d_0 \cdot (s^3 + s^2 \cdot c_2 + s \cdot c_1 + c_0)}{c_1 \cdot (s^3 + s^2 \cdot \alpha_2 + s \cdot \alpha_1 + \alpha_0)},$$

where $d_0 = wa^2$ $c_0 = a \cdot K_\phi A \cdot b \cdot \frac{K_{vco}}{N}$, $c_1 = K_\phi A \cdot b \cdot \frac{K_{vco}}{N}$, $c_2 = b$, $\alpha_0 = a \cdot wa^2$, $\alpha_1 = wa^2 \cdot \sqrt{2} \cdot a \cdot wa$, and $\alpha_1 = \sqrt{2} \cdot wa + a$.

Figure 4:
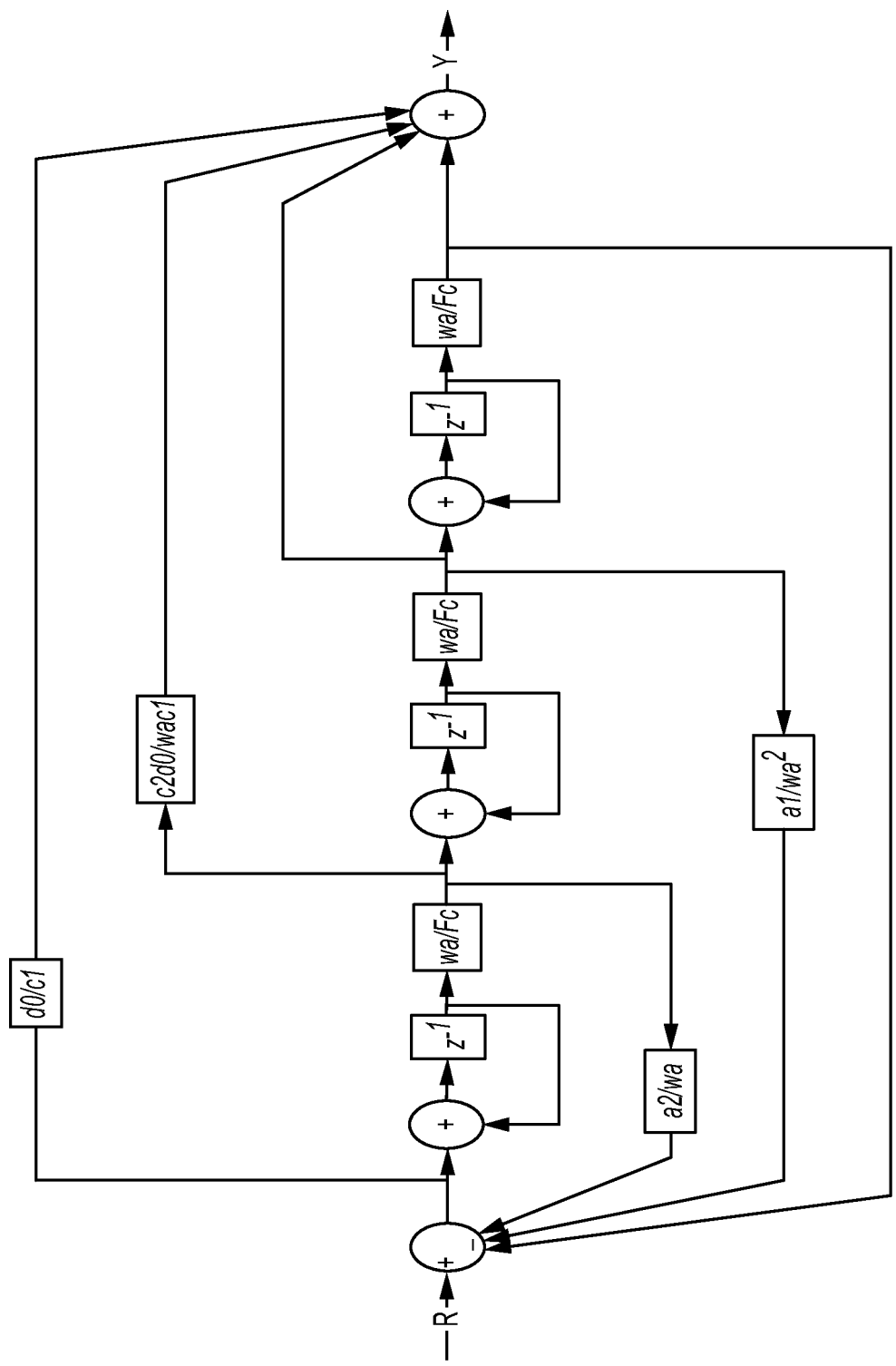
FIG. 4 depicts an exemplary digital state variable $3^{rd}$ order compensator for a compensation filter.

The analog filter described by the compensation function may be implemented in the compensation filter 301 using canonical state variable implementation, where Fc may be the sampling frequency of the compensation filter 301. FIG. 4 depicts an exemplary digital state variable 3$^{rd}$ order compensator for a compensation filter. The filter coefficients may be calculated according to equations as show in FIG. 4, based on the values of the programmable coefficients or parameters of the transmitting device which may be stored in, for example, the ODU 101.

Figure 5:
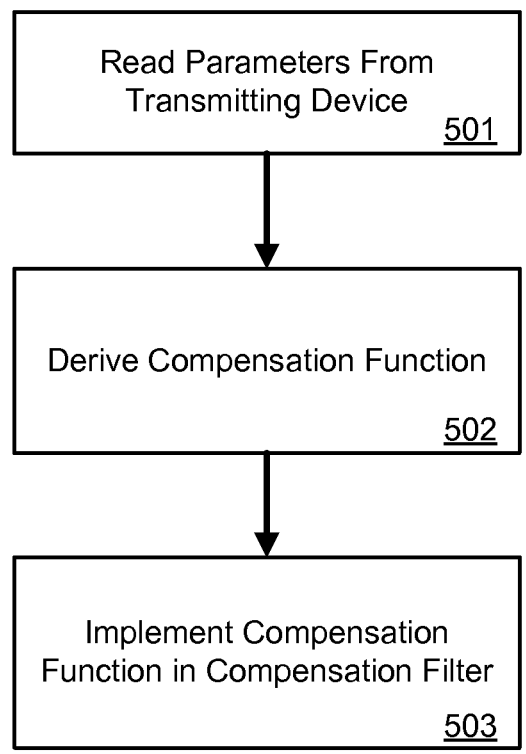
FIG. 5 depicts an exemplary procedure for installing the coefficients of a compensation filter.

FIG. 5 depicts an exemplary procedure for installing a compensation filter. In block 501, parameters may be read from a transmitter. The compensation filter 301 may be installed in transmitting device, such as a VSAT. For example, the compensation filter 301 may be installed in the IDU 103 of a VSAT. When the IDU 103 is installed and connected to the ODU 101 of the VSAT, the programmable coefficients and parameters stored in the ODU 101 may be read by the IDU 103.

In block 502, a compensation function may be derived. For example, the compensation filter 301 may derive a compensation function, as described above, using the programmable coefficients and parameters. The compensation function may be, for, example, a 3$^{rd}$ order compensation function derived based on a wanted frequency response and the frequency response of the phase locked loop 202.

In block 503, the derived compensation function may be implemented in the compensation filter. For example, the compensation function may be implemented in the compensation filter 301 by setting the filter coefficients in the compensation filter based on the compensation function derived using the programmable coefficients and parameters for the receiving device, such as the ODU 101 of the VSAT. The programming may occur in the hardware of the compensation filter 301.

As used herein, a "computer" or "computer system" may be, for example and without limitation, either alone or in combination, a personal computer (PC), server-based computer, main frame, server, microcomputer, minicomputer, laptop, personal data assistant (PDA), cellular phone, pager, processor, including wireless and/or wire line varieties thereof, and/or any other computerized device capable of configuration for receiving, storing and/or processing data for standalone application and/or over a networked medium or media. Examples of communication media that can be employed include, without limitation, wireless data networks, wire line networks, and/or a variety of networked media.

Computers and computer systems described herein may include operatively associated computer-readable media such as memory for storing software applications used in obtaining, processing, storing and/or communicating data. It can be appreciated that such memory can be internal, external, remote or local with respect to its operatively associated computer or computer system. Memory may also include any means for storing software or other instructions including, for example and without limitation, a hard disk, an optical disk, floppy disk, DVD, compact disc, memory stick, ROM (read only memory), RAM (random access memory), PROM (programmable ROM), EEPROM (extended erasable PROM), and/or other like computer-readable media.

In general, computer-readable media may include any medium capable of being a carrier for an electronic signal representative of data stored, communicated or processed in accordance with embodiments of the present invention. Where applicable, method steps described herein may be embodied or executed as instructions stored on a computer-readable medium or media.

It is to be understood that the figures and descriptions of the present invention have been simplified to illustrate elements that are relevant for a clear understanding of the present invention, while eliminating, for purposes of clarity, other elements. Those of ordinary skill in the art will recognize, however, that these and other elements may be desirable. However, because such elements are well known in the art, and because they do not facilitate a better understanding of the present invention, a discussion of such elements is not provided herein. It should be appreciated that the figures are presented for illustrative purposes and not as construction drawings. Omitted details and modifications or alternative embodiments are within the purview of persons of ordinary skill in the art.

It can be appreciated that, in certain aspects of the present invention, a single component may be replaced by multiple components, and multiple components may be replaced by a single component, to provide an element or structure or to perform a given function or functions. Except where such substitution would not be operative to practice certain embodiments of the present invention, such substitution is considered within the scope of the present invention.

The examples presented herein are intended to illustrate potential and specific implementations of the present invention. It can be appreciated that the examples are intended primarily for purposes of illustration of the invention for those skilled in the art. The diagrams depicted herein are provided by way of example. There may be variations to these diagrams or the operations described herein without departing from the spirit of the invention. For instance, in certain cases, method steps or operations may be performed or executed in differing order, or operations may be added, deleted or modified.

Furthermore, whereas particular embodiments of the invention have been described herein for the purpose of illustrating the invention and not for the purpose of limiting the same, it will be appreciated by those of ordinary skill in the art that numerous variations of the details, materials and arrangement of elements, steps, structures, and/or parts may be made within the principle and scope of the invention without departing from the invention as described in the following claims.

What is claimed is:

1. An apparatus for phase locked loop ("PLL") bandwidth expansion comprising:

a transmitting device including a programmable hardware compensation filter configured to receive a transmitted signal and output a filtered signal, and a PLL circuit installed in front of the compensation filter and configured to receive the filtered signal and output a modulated carrier signal, the programmable hardware compensation filter configured to be programmed with a compensation function having filter coefficients, wherein the filter coefficients are determined from programmable coefficients and parameters stored on the transmitting device, and wherein a function of the programmable hardware compensation filter ("Fcomp(s)") is:

$$Fcomp(s) = \frac{y_0 \cdot (s^5 + s^4 \cdot x_4 + s^3 \cdot x_3 + s^2 \cdot x_2 + s \cdot x_1 + x_0)}{x_1 \cdot (s^5 + s^4 \cdot z_4 + s^3 \cdot z_3 + s^2 \cdot z_2 + s \cdot z_1 + z_0)},$$

where $$x_0 = a \cdot K_\phi A \cdot b \cdot w_n^2 \cdot \frac{K_{vco}}{N}$$

$$x_1 = K_\phi A \cdot b \cdot w_n^2 \cdot \frac{K_{vco}}{N}$$

$$x_2 = w_n^2 \cdot b,$$

$$x_3 = w_n^2 + 2\xi \cdot w_n \cdot b$$

$$x_4 = w_n^2 + 2\xi \cdot w_n \cdot b$$

$$y_0 = wa^4$$

$$y_1 = b_1 \cdot wa^3$$

$$y_2 = b_2 \cdot wa^2$$

$$y_3 = b_3 \cdot wa$$

$$z_0 = y_0 \cdot \frac{x_0}{x_1}$$

$$z_1 = y_0 + y_1 \cdot \frac{x_0}{x_1}$$

$$z_2 = y_1 + y_2 \cdot \frac{x_0}{x_1}$$

$$z_3 = y_2 + y_3 \cdot \frac{x_0}{x_1}$$

$$z_4 = y_3 + \frac{x_0}{x_1}$$

and where s is a Laplace transform operator (jw), $x_0$, $x_1$, $x_2$, $x_3$, $x_4$, $y_0$, $y_1$, $y_2$, $y_3$, $z_0$, $z_1$, $z_2$, $z_3$, and $z_4$, are the filter coefficients, and $K_\phi$, $K_{vco}$, A, N, a, b, $w_n$, wa, and $\xi$ are the programmable coefficients and parameters such that $K_\phi$ includes phase detector gain, $K_{vco}$ includes voltage controlled oscillator gain, A includes a gain value, N includes a variable divider value, a includes a 'zero', b includes a 'pole', $w_n$ includes a filter natural frequency, wa is a desired bandwidth, and $\xi$ includes a damping factor, and wherein a frequency response of the PLL circuit combined with the programmable hardware compensation filter ("Freq(s)") is:

$$Freq(s) = \frac{wa^4}{s^4 + s^3 \cdot b_3 \cdot wa + s^2 \cdot b_2 \cdot wa^2 + s \cdot b_1 \cdot wa^3 + wa^4}.$$

2. The apparatus of claim 1, wherein a transfer function of the PLL circuit is:

$$PLL(s) = \frac{s \cdot x_1 + x_0}{s^5 + s^4 \cdot x_4 + s^3 \cdot x_3 + s^2 \cdot x_2 + s \cdot x_1 + x_0}.$$

3. The apparatus of claim 2, wherein the compensation function is based on the transfer function of the PLL circuit and a wanted frequency response.

4. The apparatus of claim 1, wherein the transmitting device is a Very Small Aperture Terminal that includes an indoor unit and an outdoor unit.

5. The apparatus of claim 4, wherein the PLL circuit is included within one of the indoor unit and the outdoor unit.

6. The apparatus of claim 4, wherein the programmable hardware compensation filter is included within the indoor unit and the programmable coefficients are included within the outdoor unit.

7. The apparatus of claim 4, wherein indoor unit includes a processor configured to:
   read the programmable coefficients within the outdoor unit responsive to the outdoor unit being connected to the indoor unit;
   determine the compensation function based on the read programmable coefficients; and
   implement the compensation function within the programmable hardware compensation filter.

8. The apparatus of claim 1, wherein the transmitting device includes:
   at least one of a phase modulator and a frequency modulator located between the PLL circuit; and
   the programmable hardware compensation filter, and
   wherein the transmitting device is configured to i) modulate a filtered signal from the programmable hardware compensation filter using a reference clock to produce a modulated reference signal, and ii) transmit the modulated reference signal to the PLL circuit.

9. The apparatus of claim 1, wherein $K_\phi=2/(2\pi)$, $K_{vco}=2\pi*375e^6$, A=0.53, N=32, a=$2\pi*37.7e^3$, b=$2\pi*9.9e^6$, $w_n=2\pi*15.65e^6$, and $\xi=0.462$.

10. The apparatus of claim 1, wherein $b_1=2.6$, $b_2=3.4$, and $b_3=2.6$.

11. The apparatus of claim 1, wherein a transfer function of the PLL circuit is:

$$PLL(s) = \frac{s \cdot x_1 + x_0}{s^5 + s^4 \cdot x_4 + s^3 \cdot x_3 + s^2 \cdot x_2 + s \cdot x_1 + x_0}.$$

12. An apparatus for phase locked loop ("PLL") bandwidth expansion comprising:
   a programmable hardware compensation filter configured to receive an input signal and output a filtered signal; and
   a PLL circuit installed in front of the programmable hardware compensation filter and configured to receive the filtered signal and output a modulated carrier signal,
   wherein the programmable hardware compensation filter is programmed with a compensation function having filter coefficients that are determined from programmable coefficients and parameters of a transmitting device, a frequency response of the PLL circuit, and a wanted frequency response, and
   wherein the compensation function ("Fcomp(s)") is:

$$Fcomp(s) = \frac{y_0 \cdot (s^5 + s^4 \cdot x_4 + s^3 \cdot x_3 + s^2 \cdot x_2 + s \cdot x_1 + x_0)}{x_1 \cdot (s^5 + s^4 \cdot z_4 + s^3 \cdot z_3 + s^2 \cdot z_2 + s \cdot z_1 + z_0)},$$

where $$x_0 = a \cdot K_\phi A \cdot b \cdot w_n^2 \cdot \frac{K_{vco}}{N}$$

$$x_1 = K_\phi A \cdot b \cdot w_n^2 \cdot \frac{K_{vco}}{N}$$

$$x_2 = w_n^2 \cdot b,$$

$$x_3 = w_n^2 + 2\xi \cdot w_n \cdot b$$

$$x_4 = w_n^2 + 2\xi \cdot w_n \cdot b$$

$$y_0 = wa^4$$

$$y_1 = b_1 \cdot wa^3$$

$$y_2 = b_2 \cdot wa^2$$

$$y_3 = b_3 \cdot wa$$

$$z_0 = y_0 \cdot \frac{x_0}{x_1}$$

$$z_1 = y_0 + y_1 \cdot \frac{x_0}{x_1}$$

$$z_2 = y_1 + y_2 \cdot \frac{x_0}{x_1}$$

$$z_3 = y_2 + y_3 \cdot \frac{x_0}{x_1}$$

$$z_4 = y_3 + \frac{x_0}{x_1}$$

and where s is a Laplace transform operator (jw), $x_0$, $x_1$, $x_2$, $x_3$, $x_4$, $y_0$, $y_1$, $y_2$, $y_3$, $z_0$, $z_1$, $z_2$, $z_3$, and $z_4$, are the filter coefficients, and $K_\phi$, $K_{vco}$, A, N, a, b, $w_n$, wa, and $\xi$ are the programmable coefficients and parameters such that $K_\phi$ includes phase detector gain, $K_{vco}$ includes voltage controlled oscillator gain, A includes a gain value, N includes a variable divider value, a includes a 'zero', b includes a 'pole', $w_n$ includes a filter natural frequency, wa is a desired bandwidth, and $\xi$ includes a damping factor, and wherein a frequency response of the PLL combined with the programmable hardware compensation filter ("Freq(s)") is:

$$Freq(s) = \frac{wa^4}{s^4 + s^3 \cdot b_3 \cdot wa + s^2 \cdot b_2 \cdot wa^2 + s \cdot b_1 \cdot wa^3 + wa^4}.$$

13. The apparatus of claim 12, wherein the compensation function is a function for the wanted frequency response divided by a function for the frequency response of the PLL circuit.

14. The apparatus of claim 12, wherein the programmable hardware compensation filter and the PLL circuit in combination produce a Butterworth response.

15. The apparatus of claim 12, wherein the programmable hardware compensation filter includes at least one of an application specific integrated circuit, a field programmable gate array, and a combination of an application specific integrated circuit and a filed programmable gate array.

16. The apparatus of claim 12, wherein the transmitting device includes a Very Small Aperture Terminal and at least a portion of the programmable coefficients and parameters are stored in an outdoor unit of the Very Small Aperture Terminal.

17. A method for phase locked loop ("PLL") bandwidth expansion comprising:
reading, via a processor, programmable coefficients and parameters stored within an outdoor unit of a transmitting device;
determining, via the processor, a compensation function including filtering coefficients based on the programmable coefficients and parameters, the compensation function relating to a function for a frequency response of a PLL circuit configured to receive a filtered signal and output a modulated carrier signal, which is installed in front of a programmable hardware compensation filter configured to receive an input signal and output the filtered signal that includes the compensation function; and
implementing, via the processor, the compensation function of the programmable hardware compensation filter within the transmitting device,
wherein the compensation function ("Fcomp(s)") is:

$$Fcomp(s) = \frac{y_0 \cdot (s^5 + s^4 \cdot x_4 + s^3 \cdot x_3 + s^2 \cdot x_2 + s \cdot x_1 + x_0)}{x_1 \cdot (s^5 + s^4 \cdot z_4 + s^3 \cdot z_3 + s^2 \cdot z_2 + s \cdot z_1 + z_0)},$$

where $$x_0 = a \cdot K_\phi A \cdot b \cdot w_n^2 \cdot \frac{K_{vco}}{N}$$

$$x_1 = K_\phi A \cdot b \cdot w_n^2 \cdot \frac{K_{vco}}{N}$$

$$x_2 = w_n^2 \cdot b,$$

$$x_3 = w_n^2 + 2\xi \cdot w_n \cdot b$$

$$x_4 = w_n^2 + 2\xi \cdot w_n \cdot b$$

$$y_0 = wa^4$$

$$y_1 = b_1 \cdot wa^3$$

$$y_2 = b_2 \cdot wa^2$$

$$y_3 = b_3 \cdot wa$$

$$z_0 = y_0 \cdot \frac{x_0}{x_1}$$

$$z_1 = y_0 + y_1 \cdot \frac{x_0}{x_1}$$

$$z_2 = y_1 + y_2 \cdot \frac{x_0}{x_1}$$

$$z_3 = y_2 + y_3 \cdot \frac{x_0}{x_1}$$

$$z_4 = y_3 + \frac{x_0}{x_1}$$

and where s is a Laplace transform operator (jw), $x_0$, $x_1$, $x_2$, $x_3$, $x_4$, $y_0$, $y_1$, $y_2$, $y_3$, $z_0$, $z_1$, $z_2$, $z_3$, and $z_4$, are the filter coefficients, and $K_\phi$, $K_{vco}$, A, N, a, b, $w_n$, wa, and $\xi$ are the programmable coefficients and parameters such that $K_\phi$ includes phase detector gain, $K_{vco}$ includes voltage controlled oscillator gain, A includes a gain value, N includes a variable divider value, a includes a 'zero', b includes a 'pole', $w_n$ includes a filter natural frequency, wa is a desired bandwidth, and $\xi$ includes a damping factor, and wherein a frequency response of the PLL circuit combined with the programmable hardware compensation filter ("Freq(s)") is:

$$Freq(s) = \frac{wa^4}{s^4 + s^3 \cdot b_3 \cdot wa + s^2 \cdot b_2 \cdot wa^2 + s \cdot b_1 \cdot wa^3 + wa^4}.$$

18. The method of claim 17, further comprising:
determining the outdoor unit has been communicatively coupled to an indoor unit of the transmitting device; and
responsive to determining the outdoor unit has been communicatively coupled to the indoor unit, reading the programmable coefficients and parameters.

19. The method of claim 18, wherein the indoor unit includes a set-top-box receiver and the outdoor unit includes a satellite dish, and wherein the outdoor unit is communicatively coupled to the indoor unit during a television or Internet installation procedure.

20. The method of claim 17, wherein a transfer function of the PLL circuit is:

$$PLL(s) = \frac{s \cdot x_1 + x_0}{s^5 + s^4 \cdot x_4 + s^3 \cdot x_3 + s^2 \cdot x_2 + s \cdot x_1 + x_0}.$$

21. The method of claim 20, wherein the compensation function is related to a function for a wanted frequency response divided by the transfer function of the PLL circuit.

22. The method of claim 17, further comprising communicating with a satellite after implementing the compensation function within the transmitting device.

* * * * *

UNITED STATES PATENT AND TRADEMARK OFFICE
CERTIFICATE OF CORRECTION

| | | |
|---|---|---|
| PATENT NO. | : 9,590,645 B2 | Page 1 of 1 |
| APPLICATION NO. | : 14/816448 | |
| DATED | : March 7, 2017 | |
| INVENTOR(S) | : Jackson et al. | |

It is certified that error appears in the above-identified patent and that said Letters Patent is hereby corrected as shown below:

In the Claims

In Claim 15, Column 9, Line 12, replace the phrase "filed programmable gate array" with the phrase "field programmable gate array".

Signed and Sealed this
Fourth Day of July, 2017

Joseph Matal
*Performing the Functions and Duties of the*
*Under Secretary of Commerce for Intellectual Property and*
*Director of the United States Patent and Trademark Office*